(12) United States Patent
Huang et al.

(10) Patent No.: US 8,912,601 B2
(45) Date of Patent: Dec. 16, 2014

(54) DOUBLE DIFFUSED DRAIN METAL OXIDE SEMICONDUCTOR DEVICE AND MANUFACTURING METHOD THEREOF

(71) Applicants: Tsung-Yi Huang, HsinChu (TW); Chien-Hao Huang, Magong (TW)

(72) Inventors: Tsung-Yi Huang, HsinChu (TW); Chien-Hao Huang, Magong (TW)

(73) Assignee: Richtek Technology Corporation, Hsin-Chu (TW)

( * ) Notice: Subject to any disclaimer, the term of this patent is extended or adjusted under 35 U.S.C. 154(b) by 0 days.

(21) Appl. No.: 14/173,571

(22) Filed: Feb. 5, 2014

(65) Prior Publication Data

US 2014/0151799 A1 Jun. 5, 2014

Related U.S. Application Data

(62) Division of application No. 13/555,163, filed on Jul. 22, 2012, now Pat. No. 8,686,504.

(51) Int. Cl.

| H01L 29/66 | (2006.01) |
|---|---|
| H01L 29/78 | (2006.01) |
| H01L 29/08 | (2006.01) |
| H01L 21/8234 | (2006.01) |
| H01L 27/088 | (2006.01) |
| H01L 29/06 | (2006.01) |
| H01L 29/10 | (2006.01) |

(52) U.S. Cl.
CPC .......... *H01L 29/78* (2013.01); *H01L 29/66689* (2013.01); *H01L 29/7816* (2013.01); *H01L 29/0878* (2013.01); *H01L 21/823412* (2013.01); *H01L 21/823418* (2013.01); *H01L 27/088* (2013.01); *H01L 29/0653* (2013.01); *H01L 29/0696* (2013.01); *H01L 29/1083* (2013.01); *H01L 29/1095* (2013.01)
USPC .................................. 257/343; 257/E27.064

(58) Field of Classification Search
CPC ........................ H01L 29/7833; H01L 29/7835
USPC .......................................... 257/343, E27.064
See application file for complete search history.

(56) References Cited

U.S. PATENT DOCUMENTS

| 6,020,227 | A * | 2/2000 | Bulucea | 438/194 |
| 2006/0197149 | A1* | 9/2006 | Fujimoto | 257/335 |
| 2010/0102388 | A1* | 4/2010 | Levin et al. | 257/343 |
| 2013/0270634 | A1* | 10/2013 | Huang et al. | 257/336 |

* cited by examiner

*Primary Examiner* — Eva Y Montalvo
*Assistant Examiner* — Samuel Lair
(74) *Attorney, Agent, or Firm* — Tung & Associates (57) ABSTRACT

The present invention discloses a double diffused drain metal oxide semiconductor (DDDMOS) device and a manufacturing method thereof. The DDDMOS device is formed in a substrate, and includes a first well, a gate, a diffusion region, a source, and a drain. A low voltage device is also formed in the substrate, which includes a second well and a lightly doped drain (LDD) region, wherein the first well and the diffusion region are formed by process steps which also form the second well and the LDD region in the low voltage device, respectively.

6 Claims, 7 Drawing Sheets

DOUBLE DIFFUSED DRAIN METAL OXIDE SEMICONDUCTOR DEVICE AND MANUFACTURING METHOD THEREOF

This is a Divisional of a co-pending application Ser. No. 13/555,163, filed on Jul. 22, 2012.

BACKGROUND OF THE INVENTION

1. Field of Invention

The present invention relates to a double diffused drain metal oxide semiconductor (DDDMOS) device and a manufacturing method thereof; particularly, it relates to such DDDMOS device and manufacturing method thereof wherein the DDDMOS device is formed by common process steps which also form a low voltage device.

2. Description of Related Art

Figure 1A:
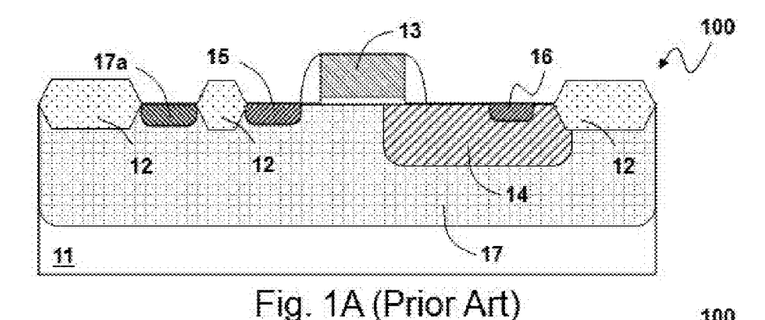
FIGS. 1A-1B show a cross-section view and a top view of a prior art DDDMOS device 100 respectively.
Figure 1B:
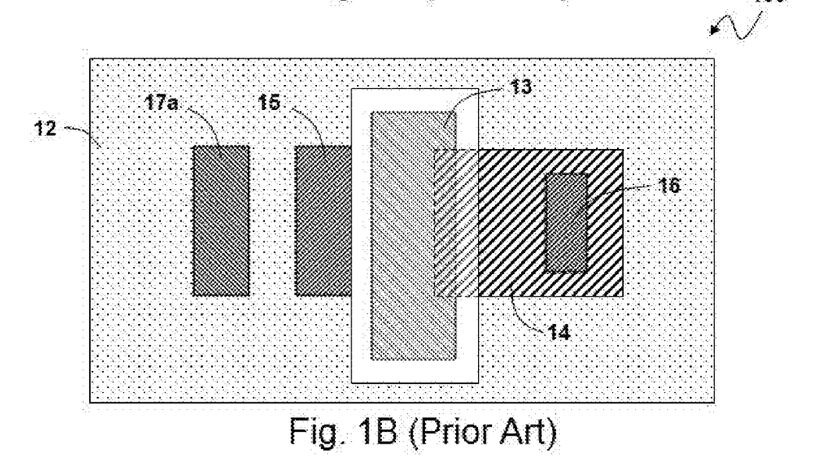

FIGS. 1A-1B show a cross-section view and a top view of a prior art double diffused drain metal oxide semiconductor (DDDMOS) device 100, respectively. As shown in FIGS. 1A-1B, a P-type substrate 11 has multiple field oxide regions 12 by which a device region of the DDDMOS device 100 is defined. The field oxide region 12 for example is a local oxidation of silicon (LOCOS) structure or a shallow trench isolation (STI) structure, the former being shown in the figures. The DDDMOS device 100 includes a gate 13, a drift region 14, a source 15, a drain 16, and a well 17. The drift region 14, the source 15 and the drain 16 are defined by lithography process steps and formed by ion implantation process steps, wherein the lithography process step defines the implantation region by a photoresist mask together with a self-alignment effect provided by all or part of the gate 13, and the ion implantation process step implants P-type impurities to the defined region in the form of accelerated ions. The source 15 and the drain 16 are beneath the gate 13 and at different sides thereof respectively. The well 17 and the well contact 17a are defined by lithography process steps and formed by ion implantation process steps, wherein the lithography process step defines the implantation region by a photoresist mask, and the ion implantation process step implants N-type impurities to the defined region in the form of accelerated ions. FIG. 1B is a top view of the DDDMOS device 100 showing the location arrangement of the aforementioned regions.

The DDDMOS device 100 is a high voltage device designed for applications requiring higher operation voltages. In general, a high voltage device refers to a device having a voltage swing larger than 5V between its high and low operation voltages, and a low voltage device refers to a device having a voltage swing smaller than 5V between its high and low operation voltages. If the DDDMOS device is to be integrated with the low voltage device in one substrate, due to constraints in the manufacturing process, i.e., because both devices share the same process parameters, the breakdown voltage and the conduction resistance are usually not optimized. In order not to sacrifice the breakdown voltage and the conduction resistance, additional manufacturing process steps are required, that is, at least one additional lithography process and one additional ion implantation process are required in order to provide different ion implantation parameters to achieve the required breakdown voltage and the conduction resistance, but this increases the cost.

In view of above, to overcome the drawbacks in the prior art, the present invention proposes a DDDMOS device and a manufacturing method thereof, wherein the process steps for forming the low voltage device are also applied to forming the DDDMOS device so that the manufacturing cost is not substantially increased, while the DDDMOS device may have an enhanced performance.

TOTAL OF THE INVENTION

A first objective of the present invention is to provide a double diffused drain metal oxide semiconductor (DDDMOS) device.

A second objective of the present invention is to provide a manufacturing method of a DDDMOS device.

To achieve the objectives mentioned above, from one perspective, the present invention provides a double diffused drain metal oxide semiconductor (DDDMOS) device formed in a first conductive type substrate, wherein a low voltage device is also formed in the substrate, the DDDMOS device comprising: a second conductive type first well, which is formed in the substrate by a process step which also forms a second well in the low voltage device; a first gate, which is formed on the substrate, wherein the first gate has a first side and a second side opposite to each other with respect to a channel direction, wherein part of the first well is located below part of the first gate including the first side; a first conductive type diffusion region, which is formed in the substrate by a process step which also forms a lightly doped drain in the low voltage device, wherein at least part of the diffusion region is located outside the second side with respect to the first gate; and a first source and a first drain with first conductive type, which are formed in the substrate outside the first side and the second side with respect to the first gate respectively, wherein the first drain and the first gate are separated by part of the diffusion region, and the first source is located in the first well.

From another perspective, the present invention provides a manufacturing method of a double diffused drain metal oxide semiconductor (DDDMOS) device, comprising: providing a first conductive type substrate, wherein the DDDMOS device and a low voltage device are formed in the substrate; forming a second conductive type first well in the substrate by a process step which also forms a second well in the low voltage device; forming a first gate on the substrate, wherein the first gate has a first side and a second side opposite to each other with respect to a channel direction, wherein part of the first well is located below part of the first gate including the first side; forming a first conductive type diffusion region in the substrate by a process step which also forms a lightly doped drain in the low voltage device, wherein at least part of the diffusion region is located outside the second side of the first gate; and forming a first source and a first drain with first conductive type in the substrate outside the first side and the second side with respect to the first gate respectively, wherein the first drain and the first gate are separated by part of the diffusion region, and the first source is located in the first well.

In one preferable embodiment, the substrate includes a non-epitaxial substrate, and the DDDMOS device further includes a second conductive type first deep well, which is formed in the substrate by a process step which also forms a second deep well in the low voltage device, wherein the first well, the diffusion region, the first source and the first drain are located in the first deep well.

In another preferable embodiment, the substrate includes an epitaxial layer, wherein the first well, the diffusion region, the first source, and the first drain are located in the epitaxial layer, and the first gate is on the epitaxial layer.

In the aforementioned embodiment, the DDDMOS device further includes a second conductive type buried layer, which is formed in the substrate beneath the epitaxial layer.

In another embodiment, the low voltage device may include a second gate, a second source, and a second drain, wherein the first gate, the first source, and the first drain are formed by process steps which also form the second gate, the second source, and the second drain respectively.

In one another embodiment, the DDDMOS device may further include at least one field oxide region in the substrate, by which a device region of the DDDMOS device is defined, wherein an isolation region is formed below the one field oxide region by a process step which also forms the first well, wherein the one field oxide region is located relatively nearer to the first drain.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 2A:
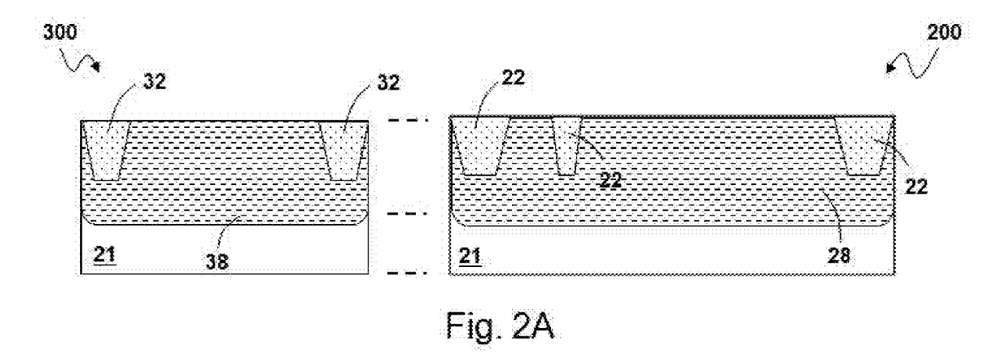
FIGS. 2A-2F show a first embodiment of the present invention.

Please refer to FIGS. 2A-2F for a first embodiment according to the present invention, wherein FIGS. 2A-2E are cross-section schematic diagrams showing a manufacturing method of a double diffused drain metal oxide semiconductor (DDDMOS) device 200 in a substrate 21 according to the present invention. This embodiment illustrates, by way of example, a manufacturing method of the DDDMOS device 200 by process steps which also form a low voltage device in the substrate 21. For better understanding, it is assumed that a low voltage PMOS device 300 and the DDDMOS device 200 of the present invention are manufactured in the same substrate 21, which are shown at left and right sides in each figure of FIGS. 2A-2E respectively, and separated by horizontal dashed lines. As shown in FIG. 2A, for example, a P-type substrate 21 is provided, which is for example but not limited to a non-epitaxial substrate. As shown in the figure, in the P-type substrate 21, a deep well 38 and field oxide regions 32 are formed in the low voltage PMOS device 300 and a deep well 28 and field oxide regions 22 are formed in the DDDMOS device 200 by the same process steps, wherein the deep wells 38 and 28 are for example but not limited to N-type.

Figure 2B:
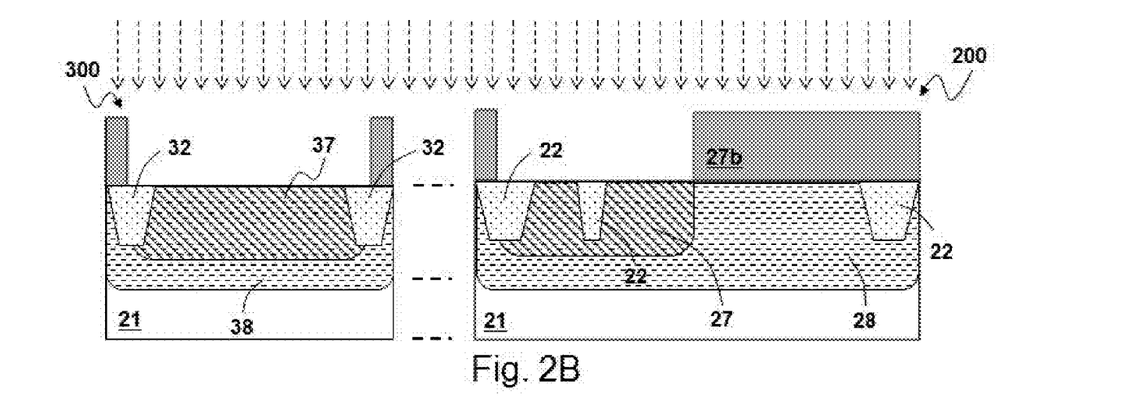

Next, as shown in FIG. 2B, in the P-type substrate 21, an N-type well 37 in the low voltage PMOS device 300, and an N-type well 27 in the DDDMOS device 200 are formed by common process steps, wherein a lithography process step defines the implantation regions of the N-type well 37 and the N-type well 27, by for example but not limited to a photoresist mask 27b, and an ion implantation process step implants N-type impurities to the defined regions in the form of accelerated ions as indicated by the dashed arrow lines.

Figure 2C:
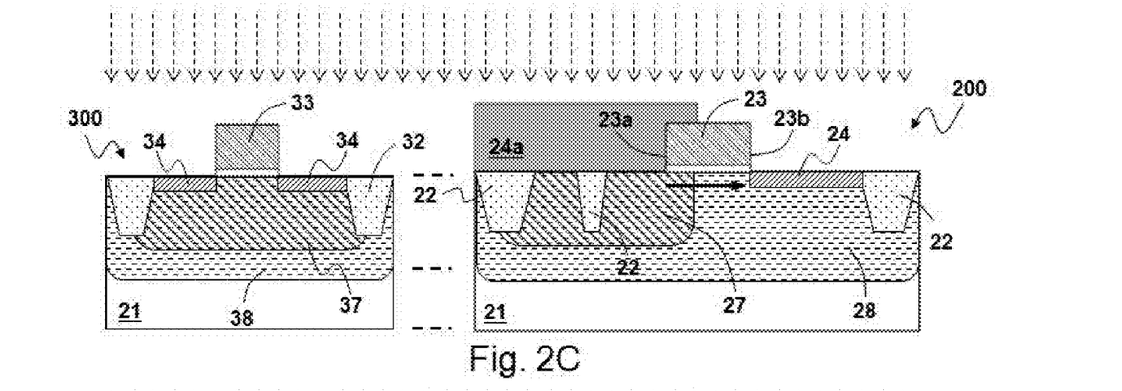

Next, as shown in FIG. 2C, a gate 33 and a P-type lightly doped drain (LDD) region 34 in the low voltage PMOS device 300, and a gate 23 and a P-type diffusion region 24 in the DDDMOS device 200 are formed by for example but not limited to common process steps, wherein a lithography process step defines the implantation regions of the LDD region 34 and the diffusion region 24 by for example but not limited to a photoresist mask 24a, and an ion implantation process step implants P-type impurities to the defined regions in the form of accelerated ions as indicated by the dashed arrow lines. The gate 23 has a first side 23a and a second side 23b opposite to each other with respect to a channel direction (as indicated by the solid arrow line, wherein the channel is located in the substrate 21 between the first side 23a and the second side 23b), wherein part of the well 27 is located below part of the first gate 23 including the first side 23a, and at least part of the diffusion region 24 is located in the substrate 21 outside the second side 23b with respect to the gate 23. The LDD region 34 mitigates the hot carrier effect of the low voltage PMOS device 300 during operation.

Figure 2D:
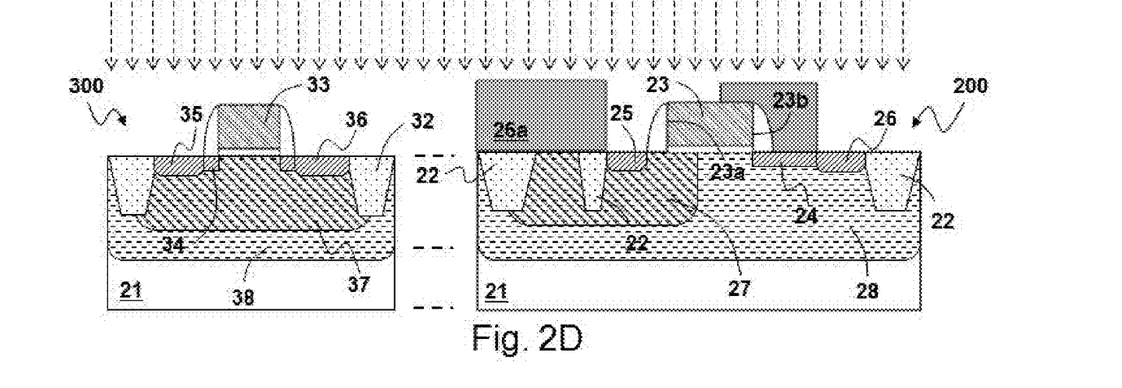

Next, as shown in FIG. 2D, a source 35 and a drain 36 in the low voltage PMOS device 300, and a source 25 and drain 26 in the DDDMOS device 200 are formed by for example but not limited to common process steps, wherein a lithography process step defines the implantation regions by for example but not limited to a photoresist mask 26a, and an ion implantation process step implants P-type impurities to the defined regions in the form of accelerated ions as indicated by the dashed arrow lines.

Figure 2E:
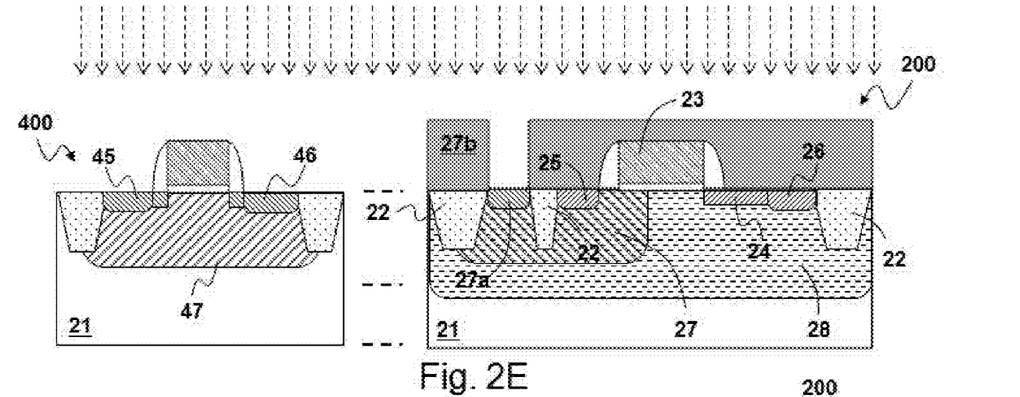
Figure 2F:
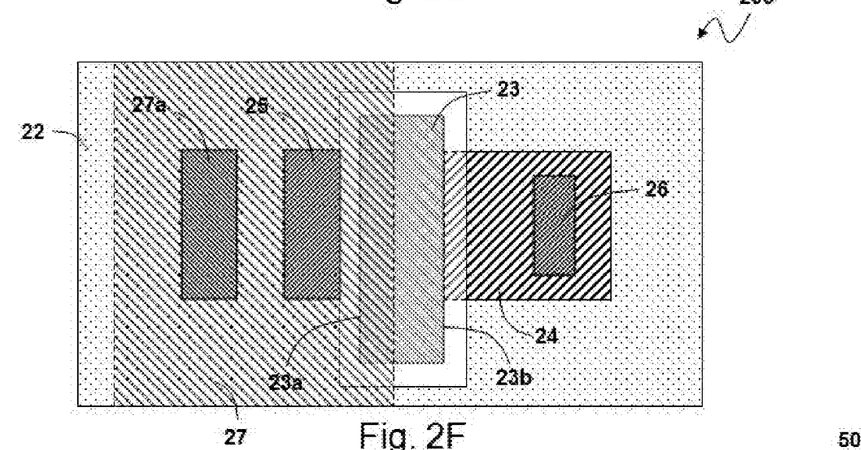

Next, as shown in FIG. 2E, a source 45 and a drain 46 in the low voltage NMOS device 400, and a well contact 27a in the DDDMOS device 200 are formed by for example but not limited to common process steps, wherein a lithography process step defines the implantation regions by for example but not limited to a photoresist mask 27b, and an ion implantation process step implants N-type impurities to the defined regions in the form of accelerated ions as indicated by the dashed arrow lines. Besides, the source 45 and the drain 46 are formed in the P-type well 47.

Figure 3A:
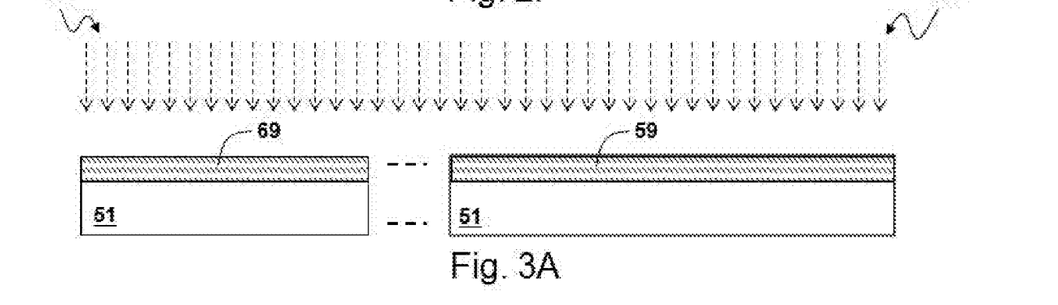
FIGS. 3A-3G show a second embodiment of the present invention.

Please refer to FIGS. 3A-3G for a second embodiment according to the present invention, wherein FIGS. 3A-3F are cross-section schematic diagrams showing a manufacturing method of a DDDMOS device 500 in a substrate 51 according to the present invention. This embodiment illustrates, by way of example, a manufacturing method of the DDDMOS device 500 by process steps which also form a low voltage device in the substrate 51. For better understanding, it is assumed that a low voltage PMOS device 600 and the DDDMOS device 500 of the present invention are manufactured in the same substrate 51, which are shown at left and right sides in each figure of FIGS. 3A-3F respectively, and separated by horizontal dashed lines. As shown in FIG. 3A, for example, a P-type substrate 51 is provided, which is for example but not limited to an epitaxial substrate. As shown in the figure, in the P-type substrate 51, an N-type buried layer 69 in the low voltage PMOS device 600 and an N-type buried layer 59 in the DDDMOS device 500 are formed by for example but not limited to a same ion implantation process step, which implants N-type impurities to the regions defined by a mask (or by blanket implantation without any mask) in the form of accelerated ions as indicated by the dashed arrow lines.

Figure 3B:
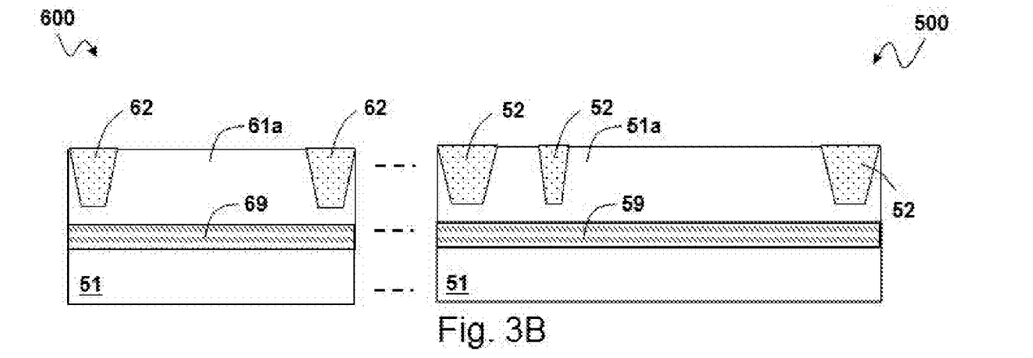

Next, as shown in FIG. 3B, an epitaxial layer 61a in the low voltage PMOS device 600, and an epitaxial layer 51a in the DDDMOS device 500 are formed by for example but not limited to a common epitaxial process step. Next, field oxide regions 62 in the low voltage PMOS device 600, and field oxide regions 52 in the DDDMOS device 500 are formed by for example but not limited to a common process step.

Figure 3C:
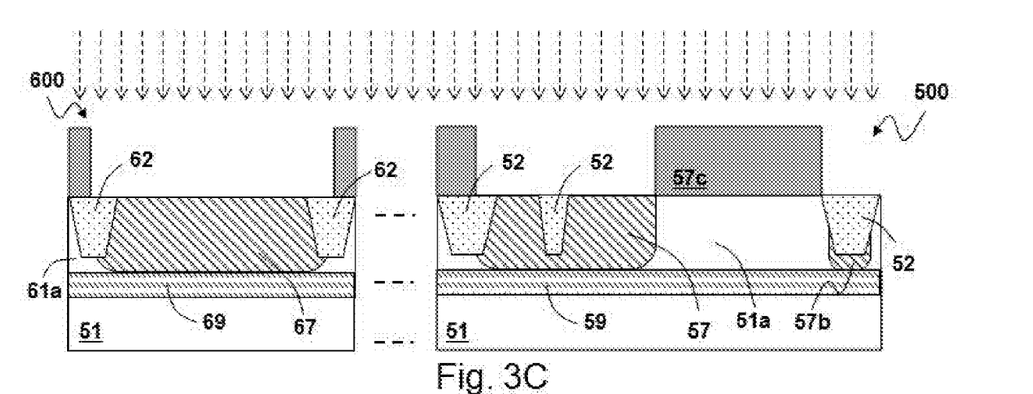

Next, as shown in FIG. 3C, in the epitaxial layers 61a and 51a, an N-type well 67 in the low voltage PMOS device 600, and an N-type well 57 and an N-type isolation region 57b in the DDDMOS device 500 are formed by a common process step, wherein the isolation region 57b is located below the field oxide region 52 which is relatively nearer to a drain 56 (referring to FIG. 3F). The N-type well 67, the N-type well 57, and the N-type isolation region 57b are defined by a lithography process step with for example but not limited to a photoresist mask 57c, and an ion implantation process step implants N-type impurities to the defined regions in the form of accelerated ions as indicated by the dashed arrow lines.

Figure 3D:
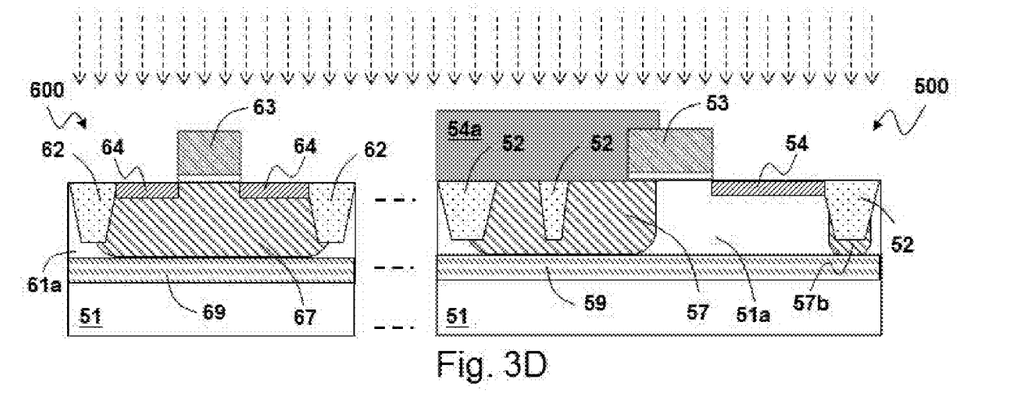

Next, as shown in FIG. 3D, a gate 63 on the epitaxial layer 61a, and a P-type LDD region 64 are formed in the epitaxial layer 61a, and a gate 53 on the epitaxial layer 51a, and a P-type diffusion region 54 are formed in the epitaxial layer 51a, by for example but not limited to common process steps, wherein a lithography process step defines the implantation regions of the LDD region 64 and the diffusion region 54 by for example but not limited to a photoresist mask 54a, and an ion implantation process step implants P-type impurities to the defined regions in the form of accelerated ions as indicated by the dashed arrow lines.

Figure 3E:
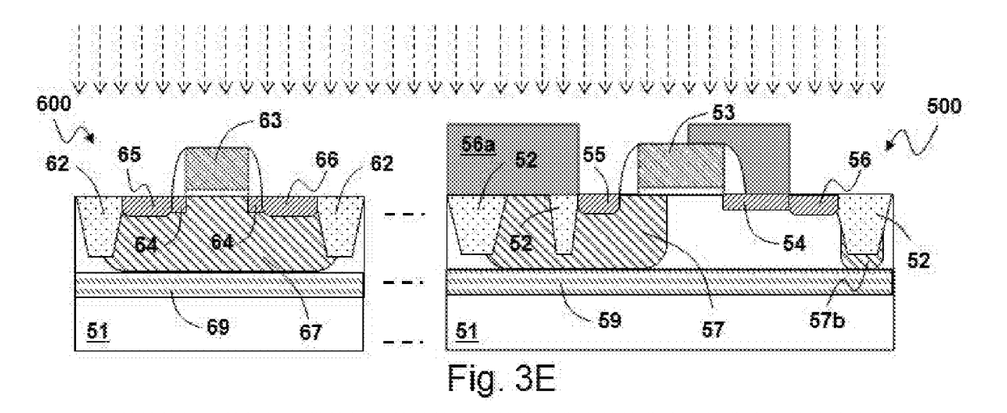

Next, as shown in FIG. 3E, a source 65 and a drain 66 in the low voltage PMOS device 600, and a source 55 and drain 56 in the DDDMOS device 500 are formed by for example but not limited to common process steps, wherein a lithography process step defines the implantation regions by for example but not limited to a photoresist mask 56a, and an ion implantation process step implants P-type impurities to the defined regions in the form of accelerated ions as indicated by the dashed arrow lines. From the top view of FIG. 3G, the drain 56 and the gate 53 are separated by part of the diffusion region 54, and the source 55 is in the well 57.

Figure 3F:
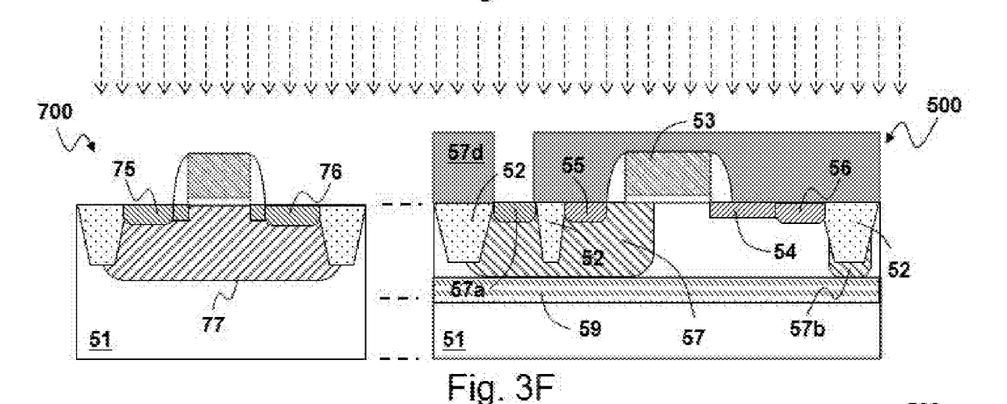
Figure 3G:
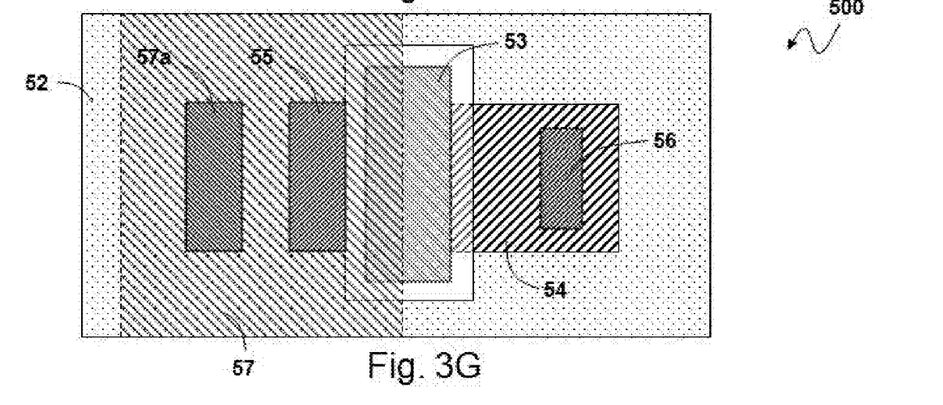

Next, as shown in FIG. 3F, a source 75 and a drain 76 in the low voltage NMOS device 700, and a well contact 57a in the DDDMOS device 500 are formed by for example but not limited to common process steps, wherein a lithography process step defines the implantation regions by for example but not limited to a photoresist mask 57d, and an ion implantation process step implants N-type impurities to the defined regions in the form of accelerated ions as indicated by the dashed arrow lines. Besides, the source 75 and the drain 76 are formed in the P-type well 77.

Figure 4:
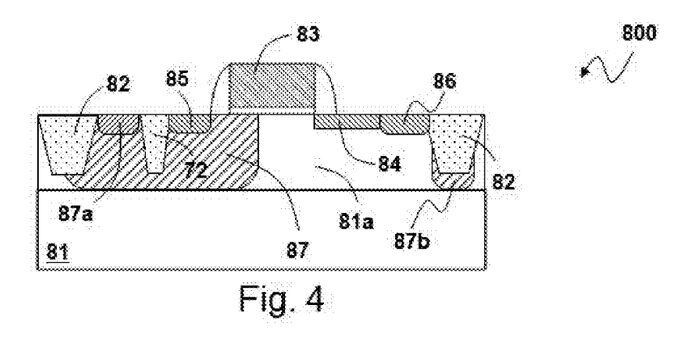
FIG. 4 shows a third embodiment of the present invention.

FIG. 4 shows a third embodiment of the present invention. FIG. 4 is a schematic diagram showing a cross-section view of a DDDMOS device 800 of the present invention. As shown in FIG. 4, the N-type DDDMOS device 800 is formed in a P-type substrate 81. The DDDMOS device 800 includes a P-type epitaxial layer 81a formed on the substrate 81, a P-type well 87 formed in the epitaxial layer 81a, a P-type well 87 formed in the epitaxial layer 81a, a P-type contact 87a, a P-type isolation region 87b, a field oxide region 82, an N-type source 85, an N-type drain 86, and a gate 83 formed on the epitaxial layer 81a. The DDDMOS device 800 is formed by process steps which also form a low voltage device (not shown) in the substrate 81. This embodiment intends to show that the DDDMOS device 800 according to the present invention may be an N-type DDDMOS device and formed in a substrate with an epitaxial layer.

Figure 5A:
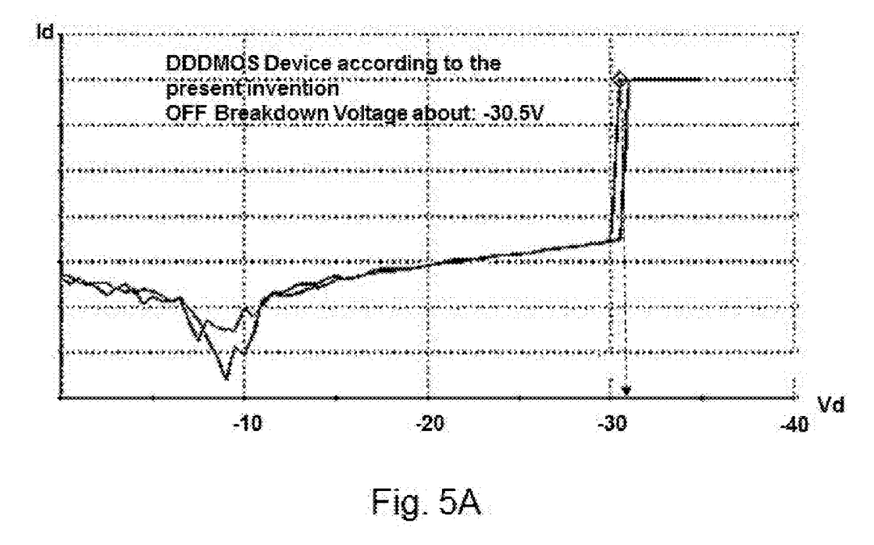
FIGS. 5A-5C show characteristic curves of the DDDMOS device according to the present invention.
Figure 5B:
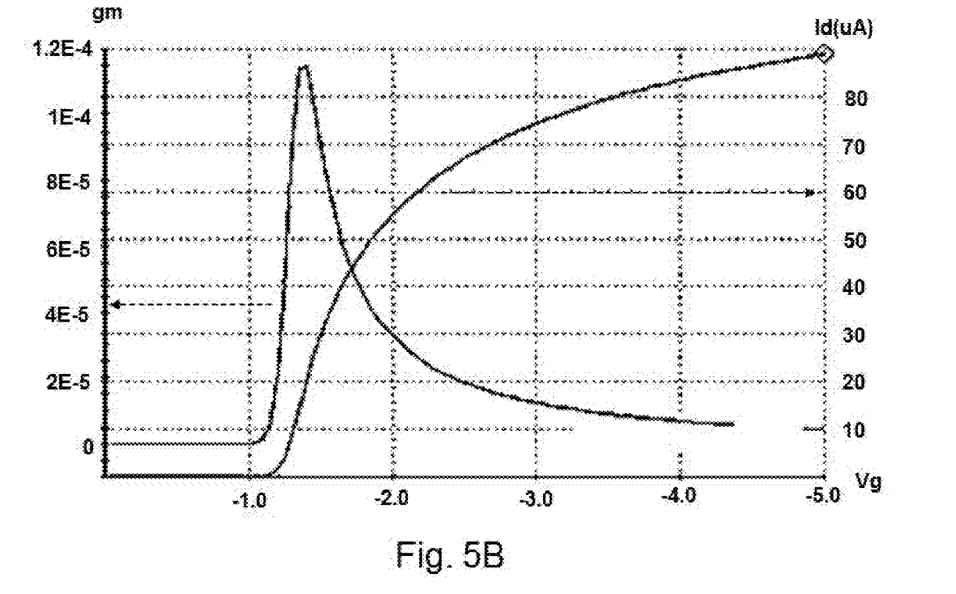
Figure 5C:
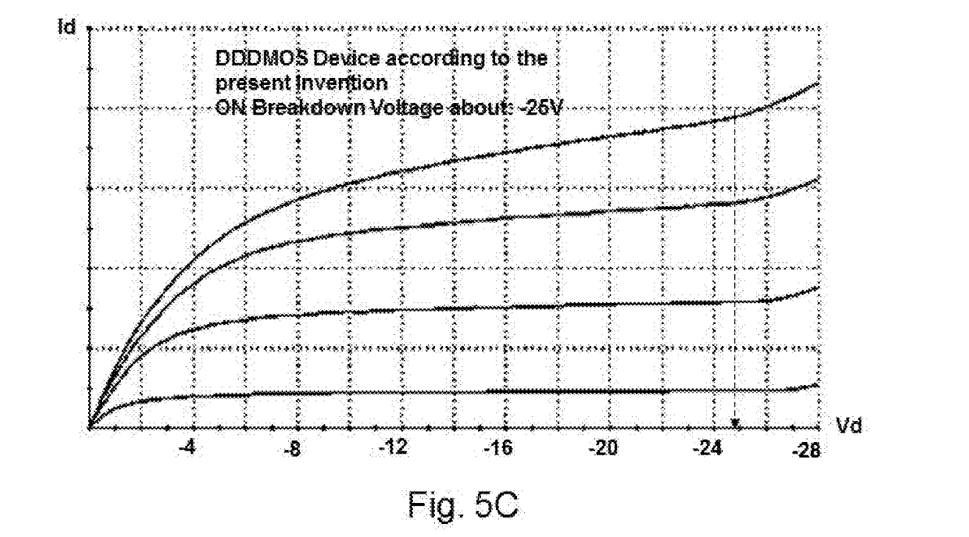

FIGS. 5A-5C show characteristic curves of a P-type DDDMOS device according to the present invention. FIG. 5A shows a characteristic curve of a drain current Id versus a drain voltage Vd of the DDDMOS device according to the present invention in the OFF operation. The breakdown voltage of the DDDMOS device in the OFF operation is around −30.5V, as indicated by the dash line shown in the figure. FIG. 5B shows characteristic curves of the drain current Id (right vertical axis) and conductance gm (left vertical axis) versus a gate voltage Vg. The threshold voltage of the DDDMOS device is around −1.2V. FIG. 5C shows a characteristic curve of the drain current Id versus the drain voltage Vd of the LDMOS device according to the present invention in the ON operation. The breakdown voltage of the DDDMOS device in the ON operation is around −25V, as indicated by the dash line shown in the figure. FIGS. 5A-5C intend to show that the high voltage DDDMOS device according to the present invention has a good performance while it may be formed by common process steps for forming a low voltage device in the same substrate without increasing the manufacturing cost.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristic of the device, such as a threshold voltage adjustment region, etc., can be added; for another example, the lithography step described in the above can be replaced by electron beam lithography, X-ray lithography, etc.; for another example, in all the aforementioned embodiments, the conductive type of each region is not limited to the type and concentration shown in the embodiments, but it may be changed to another conductive type and/or impurity concentration, with proper modifications in other regions. In view of the foregoing, the spirit of the present invention should cover all such and other modifications and variations, which should be interpreted to fall within the scope of the following claims and their equivalents. An embodiment or a claim of the present invention does not need to achieve all the objectives or advantages of the present invention. The title and abstract are provided for assisting searches but not for limiting the scope of the present invention.

What is claimed is:

1. A double diffused drain metal oxide semiconductor (DDDMOS) device formed in a first conductive type substrate, wherein a low voltage device is also formed in the substrate, the DDDMOS device comprising:

a second conductive type first well, which is formed in the substrate by a process step which also forms a second well in the low voltage device;

a first gate, which is formed on the substrate, wherein the first gate has a first side and a second side opposite to each other with respect to a channel direction, wherein part of the first well is located below part of the first gate including the first side;

a first conductive type diffusion region, which is formed in the substrate by a process step which also forms a lightly doped drain in the low voltage device, wherein at least part of the diffusion region is located outside the second side of the first gate, wherein the first conductive type diffusion region and the lightly doped drain in the low voltage device have the same depth; and a first source and a first drain of first conductive type, which are formed in the substrate outside the first side and the second side of the first gate respectively, wherein the first drain and the first gate are separated by part of the diffusion region, and the first source is located in the first well.

2. The DDDMOS device of claim 1, wherein the substrate includes a non-epitaxial substrate, and the DDDMOS device further includes a second conductive type first deep well, which is formed in the substrate by a process step which also forms a second deep well in the low voltage device, wherein the first well, the diffusion region, the first source and the first drain are located in the first deep well.

3. The DDDMOS device of claim 1, wherein the substrate includes an epitaxial layer, wherein the first well, the diffusion region, the first source, and the first drain are located in the epitaxial layer, and the first gate is on the epitaxial layer.

4. The DDDMOS device of claim 3, further comprising a second conductive type buried layer, which is formed in the substrate beneath the epitaxial layer.

5. The DDDMOS device of claim 1, wherein the low voltage device further includes a second gate, a second source, and a second drain, wherein the first gate, the first source, and the first drain are formed by process steps which also form the second gate, the second source, and the second drain respectively.

6. The DDDMOS device of claim 1, further comprising at least one field oxide region in the substrate, by which a device region of the DDDMOS device is defined, wherein an isolation region is formed below the one field oxide region by a process step which also forms the first well, wherein the one field oxide region is located relatively nearer to the first drain.

* * * * *